United States Patent
Watanabe et al.

(10) Patent No.: US 10,224,211 B2
(45) Date of Patent: Mar. 5, 2019

(54) ETCHING METHOD

(71) Applicant: Tokyo Electron Limited, Tokyo (JP)

(72) Inventors: Hikaru Watanabe, Miyagi (JP); Akihiro Tsuji, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/352,076

(22) Filed: Nov. 15, 2016

(65) Prior Publication Data

US 2017/0140923 A1    May 18, 2017

(30) Foreign Application Priority Data

Nov. 16, 2015  (JP) .................................. 2015-223867

(51) Int. Cl.
| | |
|---|---|
| H01L 21/3065 | (2006.01) |
| H01L 21/311 | (2006.01) |
| G03F 1/24 | (2012.01) |
| G03F 7/09 | (2006.01) |
| H01J 37/32 | (2006.01) |
| H01L 21/027 | (2006.01) |

(52) U.S. Cl.
CPC ............ *H01L 21/3065* (2013.01); *G03F 1/24* (2013.01); *G03F 7/091* (2013.01); *H01J 37/32009* (2013.01); *H01J 37/32091* (2013.01); *H01J 37/32165* (2013.01); *H01J 37/32724* (2013.01); *H01L 21/0276* (2013.01); *H01L 21/30655* (2013.01); *H01L 21/31116* (2013.01); *H01L 21/31138* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,263,496 B1 * | 9/2012 | Wodecki | H01L 21/31116 216/22 |
| 2009/0191711 A1 * | 7/2009 | Rui | G03F 7/40 438/695 |

FOREIGN PATENT DOCUMENTS

| | | |
|---|---|---|
| JP | 2009-164626 | 7/2009 |
| JP | 2011-134896 | 7/2011 |

* cited by examiner

*Primary Examiner* — Jiong-Ping Lu
(74) *Attorney, Agent, or Firm* — IPUSA, PLLC

(57) ABSTRACT

There is provided an etching method for etching an antireflection film including silicon according to a pattern of a resist film by using plasma processing with respect to a processing object, the processing object including an etching object film, the antireflection film including silicon laminated on the etching object film, and the resist film laminated on the antireflection film including silicon. The method includes generating plasma of a processing gas containing a fluorocarbon gas in a processing chamber, the processing object being disposed in the processing chamber, and generating plasma of a processing gas containing an inactive gas in the processing chamber, the processing object being disposed in the processing chamber. A set of the first generating and the second generating are repeatedly performed.

21 Claims, 9 Drawing Sheets

| ETCHING | | SILICON ANTIREFLECTION FILM (CF$_4$/CHF$_3$) | | ORGANIC FILM (N$_2$/H$_2$) | |
|---|---|---|---|---|---|
| FINE/COARSE PATTERN | | 1:1 (FINE PATTERN) | 1:5 (COARSE PATTERN) | 1:1 (FINE PATTERN) | 1:5 (COARSE PATTERN) |
| LOW FLOW RATIO OF CHF$_3$ GAS | | Btm. CD | Btm. CD | | |
| Btm. CD (DIFFERENCE FROM INITIAL STATE) | | 50.3 nm (−0.1) | 233.4 nm (+6.7) | 62.2 nm (+11.8) | 245.8 nm (+19.1) |
| CD Bias Δ | | +6.8 nm | | +7.3 nm | |
| MIDDLE FLOW RATIO OF CHF$_3$ GAS | | | | | |
| Btm. CD (DIFFERENCE FROM INITIAL STATE) | | 40.8 nm (−9.6) | 215.6 nm (−11.1) | 49.5 nm (−0.9) | 224.6 nm (−2.1) |
| CD Bias Δ | | −1.5 nm | | −1.2 nm | |
| HIGH FLOW RATIO OF CHF$_3$ GAS | | | | | |
| Btm. CD (DIFFERENCE FROM INITIAL STATE) | | 26.2 nm (−24.2) | 192.1 nm (−34.6) | 33.6 nm (−16.8) | 204.0 nm (−22.7) |
| CD Bias Δ | | −10.4 nm | | −5.9 nm | |

| ETCHING | ETCHING OF COMPARATIVE EXAMPLE | | ETCHING OF FIRST EMBODIMENT | |
|---|---|---|---|---|
| | 1:1 (FINE PATTERN) | 1:5 (COARSE PATTERN) | 1:1 (FINE PATTERN) | 1:5 (COARSE PATTERN) |
| ETCHING SHAPE OF SILICON ANTIREFLECTION FILM | | | | |
| PR height (loss) | 4.9 nm (33.8) | 4.9 nm (32.8) | 20.8 nm (17.9) | 15.8 nm (21.9) |
| ETCHING SHAPE OF ORGANIC FILM | | | | |
| LWR/LER | 2.98/2.67 nm | 3.86/2.72 nm | 3.61/2.56 nm | 4.81/3.28 nm |
| Btm. CD (DIFFERENCE FROM INITIAL STATE) | 52.57 nm (−4.29) | 224.23 nm (−8.42) | 58.04 nm (1.18) | 232.01 nm (−0.64) |
| CD Bias Δ | −4.13 nm | | −1.82 nm | |

FIG.8

| ETCHING | ETCHING OF FIRST EMBODIMENT | | ETCHING OF SECOND EMBODIMENT | |
|---|---|---|---|---|
| | 1:1 (FINE PATTERN) | 1:5 (COARSE PATTERN) | 1:1 (FINE PATTERN) | 1:5 (COARSE PATTERN) |
| ETCHING SHAPE OF ORGANIC FILM | | | | |
| LWR/LER | 3.61/2.56 nm | 4.81/3.28 nm | 3.67/2.56 nm | 3.89/2.95 nm |
| Btm. CD (DIFFERENCE FROM INITIAL STATE) | 58.04 nm (1.18) | 232.01 nm (−0.64) | 52.21 nm (−4.65) | 227.30 nm (−5.35) |
| CD Bias Δ | −1.82 nm | | −0.70 nm | |

ETCHING METHOD

CROSS-REFERENCE TO RELATED APPLICATION

The present application is based upon and claims the benefit of priority of Japanese Patent Application No. 2015-223867, filed on Nov. 16, 2015, the entire contents of which are incorporated by reference in their entirety.

BACKGROUND OF THE PRESENT INVENTION

1. Field of the Present Invention

The present disclosure relates to etching methods.

2. Description of the Related Art

An etching method is proposed, in which an antireflection film is processed through etching according to a pattern of a resist film, and the antireflection film and the resist film obtained through the etching process are used as a mask to perform an etching process on an object film that is disposed under the antireflection film, by performing plasma processing (e.g., Japanese Unexamined Patent Application Publication No. 2009-164626).

However, in a case where the antireflection film includes silicon and the resist film is ArF resist film, etc., an selective ratio of the antireflection film with respect to the resist film is low (e.g., 1-2). In a case where the selective ratio is low to disturb selective etching of the antireflection film with respect to the resist film, the resist film is also etched during the etching process of the antireflection film, and the resist film may be disappeared. Consequently, the object film under the antireflection film may be difficult to be etched, and the object film may not be vertically etched.

In particular, a selective ratio between an EUV resist film and the antireflection film is lower than the selective ratio between the ArF resist film and the antireflection film, where the EUV resist film is formed by using Extreme Ultra Violet (EUV) whose wavelength is 13-14 nm. Therefore, in a case where the EUV resist film is used as the mask, the etching process on the object film may become more difficult.

[Patent Document 1]: Japanese Laid-open Patent Publication No. 2009-164626

[Patent Document 2]: Japanese Laid-open Patent Publication No. 2011-134896

SUMMARY OF THE PRESENT DISCLOSURE

An object of the present disclosure is to perform the etching process so that etched shape of the object film is vertical while the selective ratio is improved.

According to an embodiment of the invention, there is provided an etching method for etching an antireflection film including silicon according to a pattern of a resist film by using plasma processing with respect to a processing object, the processing object including an etching object film, the antireflection film including silicon laminated on the etching object film, and the resist film laminated on the antireflection film including silicon. The method includes generating plasma of a processing gas containing a fluorocarbon gas in a processing chamber, the processing object being disposed in the processing chamber, and generating plasma of a processing gas containing an inactive gas in the processing chamber, the processing object being disposed in the processing chamber. A set of the first generating and the second generating are repeatedly performed.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 2B is a diagram illustrating an example etching result.

FIG. 5 is a diagram illustrating an example etching result of the first embodiment.

FIG. 8 is a diagram illustrating an example etching result of the second embodiment.

DETAILED DESCRIPTION OF PREFERRED EMBODIMENTS

Figure 1:
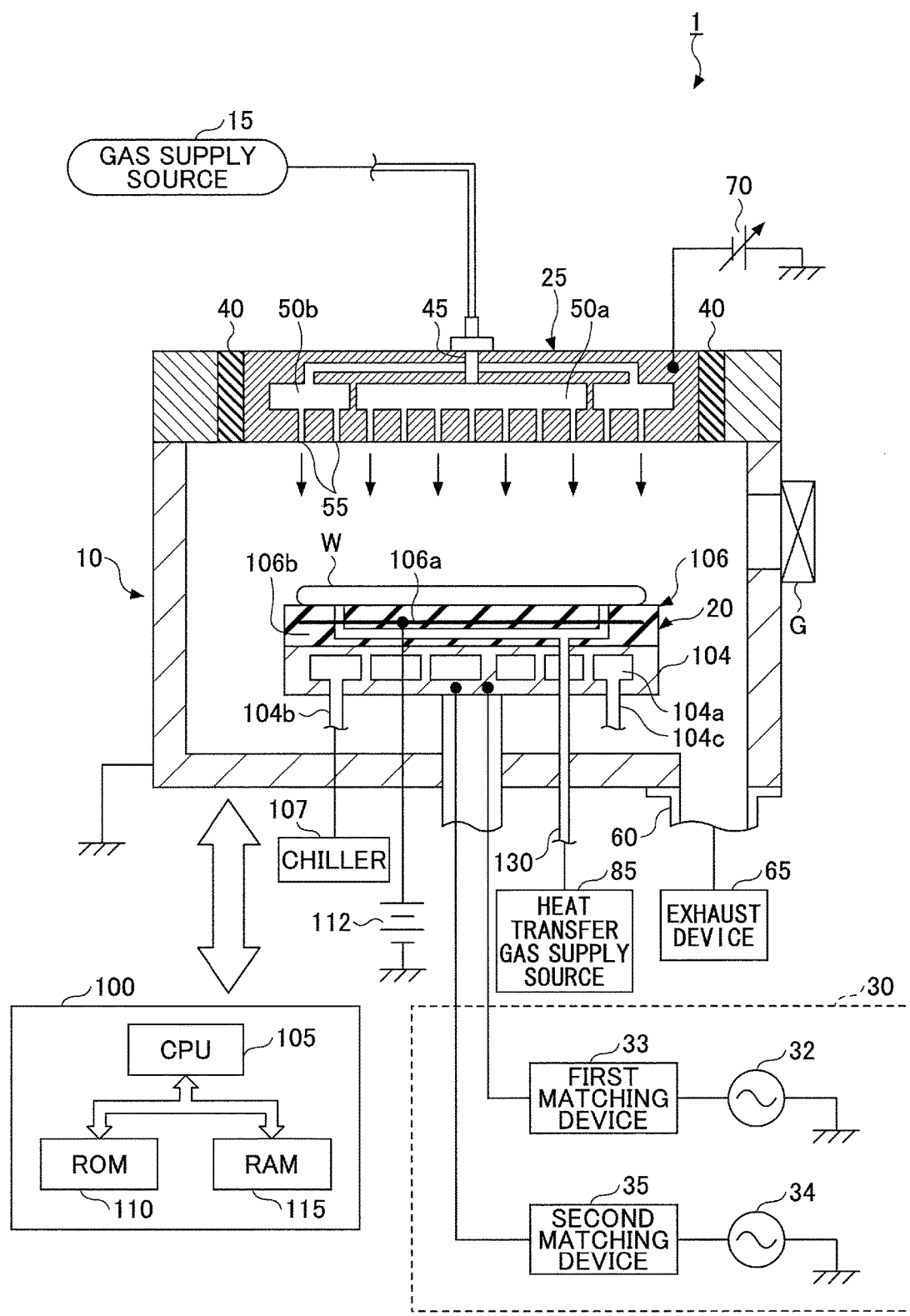
FIG. 1 is an example cross sectional view of a plasma processing apparatus.

Herein below, embodiments will be described with reference to the accompanying drawings. Additionally, in the present specification and drawings, identical reference numerals will be applied to elements or the like that have substantially similar functions and configurations to those in another embodiment, and descriptions thereof may be omitted.

<General Arrangement of Plasma Processing Apparatus>

First, a plasma processing apparatus 1 will be described with reference to FIG. 1, where the plasma processing apparatus 1 performs an plasma etching process of an embodiment of the present disclosure on a semiconductor wafer (hereinafter, simply referred to as "wafer"). FIG. 1 is an example cross sectional view of a plasma processing apparatus 1 of the present embodiment. The plasma processing apparatus 1 is a parallel flat plate type (Capacitively Coupled Plasma) processing apparatus, in which a mounting table 20 and a gas shower head 25 are disposed with facing each other in a processing chamber 10. The mounting table 20 serves as a lower electrode, while the gas shower head 25 serves as an upper electrode.

For example, the plasma processing apparatus 1 includes a cylindrical processing chamber 10 made of aluminum having an alumite-treated (anodized) surface. The processing chamber 10 is grounded. The mounting table 20 is disposed at a bottom of the processing chamber 10, and a wafer W is mounted thereon. The wafer W is an example processing object. For example, the mounting table 20 may be made of aluminum Al, titanium Ti, silicon carbide SiC, and the like. An electrostatic chuck 106 for holding the wafer W by an electrostatic attractive force is provided on the top surface of the mounting table 20. The electrostatic chuck 106 includes insulators 106b and a chuck electrode 106a is disposed between the insulators 106b. The chuck electrode 106a is connected to a DC voltage supply 112, the electrostatic chuck 106 electrostatically attracts and holds the wafer W by a Coulomb force that is generated when a DC voltage HV is applied thereto from the DC voltage supply 112.

The mounting table 20 is supported by supporting bodies 104. A coolant flow path 104a is formed inside the supporting body 104. A coolant entrance pipe 104b and a coolant exit pipe 104c are coupled to the coolant flow path 104a. For example, coolant, such as coolant water and brine, supplied from a chiller 107 flows in the coolant entrance pipe 104b, the coolant flow path 104a, and a coolant exit pipe 104c. The mounting table 20 and the electrostatic chuck 106 are cooled by the coolant.

A heat transfer gas supply source 85 supplies a heat transfer gas such as a helium gas (He) and an argon gas (Ar) on a back surface of the wafer W disposed on the electrostatic chuck 106 via a gas supply line 130. According to the configuration described above, a temperature of the electrostatic chuck 106 is controlled by the coolant flowing through the coolant flow path 104a and the heat transfer gas supplied on the back surface of the wafer W. Consequently, a temperature of the wafer W can be controlled to be a desired temperature.

A power supply apparatus 30 for supplying two-frequency-superposed electric power is coupled to the mounting table 20. The power supply apparatus 30 includes a first high frequency power supply 32 for supplying a first high frequency power (for generating plasma) at a first frequency and a second high frequency power supply 34 for supplying a second high frequency power (for generating bias voltage) at a second frequency that is lower than the first frequency. The first high frequency power supply 32 is electrically connected to the mounting table 20 via a first matching device 33. The second high frequency power supply 34 is electrically connected to the mounting table 20 via a second matching device 35. For example, the first high frequency power supply 32 applies first high frequency power at 60 MHz to the mounting table 20. The second high frequency power supply 34 applies second high frequency power at 13.56 MHz to the mounting table 20. Additionally, although the first high frequency power is applied to the mounting table 20 in the present embodiment, the first high frequency power may be applied to the gas shower head 25.

The first matching device 33 matches load impedance with internal (or output) impedance of the first high frequency power supply 32. The second matching device 35 matches the load impedance with internal (or output) impedance of the second high frequency power supply 34. The first matching device 33 operates so that the internal impedance of the first high frequency power supply 32 seemingly coincides with the load impedance when the plasma is generated in the processing chamber 10. The second matching device 35 operates so that the internal impedance of the second high frequency power supply 34 seemingly coincides with the load impedance when the plasma is generated in the processing chamber 10.

The gas shower head 25 is attached to the processing chamber 10 so as to close an opening in a ceiling portion of the processing chamber 10 through the shield ring 40 that covers periphery of the gas shower head 25. A variable DC power supply 70 is coupled to the gas shower head 25, and a voltage is applied to the gas shower head 25 by the variable DC power supply 70. The gas shower head 25 may be made of silicon.

A gas inlet 45 for introducing gas is formed in the gas shower head 25. A diffusion chamber 50a at a center portion and a diffusion chamber 50b at edge portion are provided inside the gas shower head 25, where the diffusion chamber 50a and the diffusion chamber 50b are separated from the gas inlet 45. The gas output from a gas supply source 15 is supplied to the diffusion chambers 50a and 50b via the gas inlet 45. The gas having diffused in the diffusion chambers 50a and 50b is introduced from multiple gas holes 55 toward the mounting table 20.

An exhaust port 60 is formed in the bottom of the processing chamber 10. The gas inside the processing chamber 10 is exhausted by an exhaust device 65 coupled to the exhaust port 60. Thus, inside of the processing chamber 10 can be kept at a predetermined vacuum degree. A gate valve G is provided at a side wall of the processing chamber 10. The gate valve G is used for open/close of carrying opening for carrying in/out the wafer W into/from the processing chamber 10.

The plasma processing apparatus 1 includes a control unit 100 for controlling entire operation of the plasma processing apparatus 1. The control unit 100 includes a CPU (Central Processing Unit) 105, a ROM (Read Only Memory) 110 and a RAM (Random Access Memory) 115. The CPU 105 performs processes such as etching process (described below) according to recipes stored in storage areas. Control information of the apparatus with respect to processing conditions including an etching condition are described in the recipe, where processing time, pressure (gas exhaust), high frequency power and a voltage thereof, flow ratios of various gases, temperature inside the processing chamber (temperatures of upper electrode, side wall of the processing chamber, wafer, electrostatic chuck, etc.), temperature of coolant output from chiller 107, etc. are described. Additionally, programs and recipes indicating processing conditions may be stored in a hard disk, a semiconductor memory, and the like. Also, the recipe may be stored in a portable computer readable medium such as a CD-ROM and a DVD, and may be retrieved from the portable computer readable medium set in a predetermined position of the apparatus.

When the etching process is performed, the gate valve G is controlled to be opened/closed, and the wafer W is carried into the processing chamber 10 to be mounted on the mounting table 20. The electrostatic chuck 106 electrostatically attracts and holds the wafer W by a Coulomb force that is generated when a DC voltage HV is applied to a chuck electrode 106a from the DC voltage supply 112.

Then, a processing gas and high frequency power are supplied in the processing chamber 10, thereby generating plasma. A plasma etching process is performed on the wafer W by using the generated plasma. After, the etching process, electric charge of the wafer W is discharged by applying a DC voltage HV from the DC voltage source 112 to the chuck electrode 106a so as to remove the wafer W from the electrostatic chuck 106, where a positive/negative direction of the applied DC voltage is opposite to that of DC voltage applied for holding the wafer W. The wafer W is carried out from the processing chamber 10 by controlling open/close of the gate valve G.

<Etching>

A relationship between a selective ratio and a fine/coarse pattern will be described with reference to FIG. 2A and FIG. 2B in a case where a silicon antireflection film (Si-ARC) is etched using $CHF_3$ gas and $CF_4$ gas with a mask made of ArF resist film. Line and space pattern is formed on the ArF resist film 2. Additionally, in the following, a selective ratio of the antireflection film with respect to the resist film is referred to as "mask selective ratio".

Figure 2A:
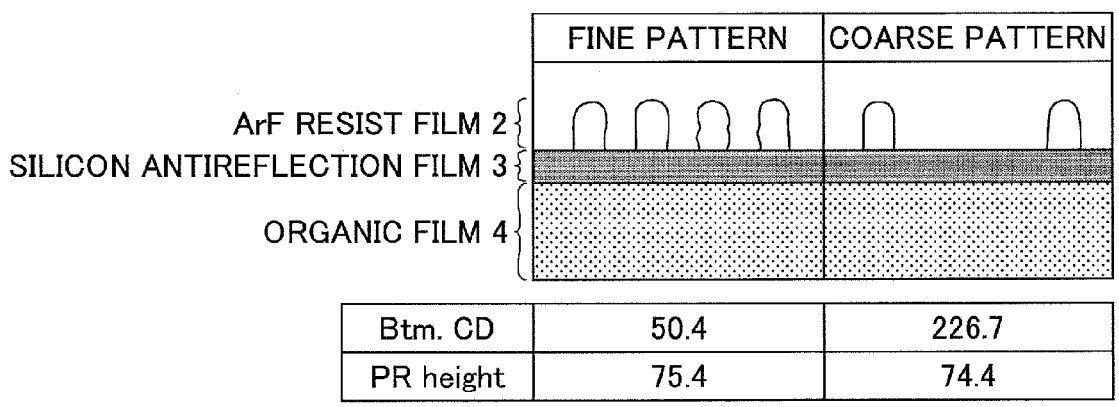
FIG. 2A is an example initial state of laminated films on the wafer W before etching process.

FIG. 2A is an example initial state of laminated films on the wafer W before etching process. The laminated films include an organic layer 4 (ODL) that is an object layer of the etching, a silicon antireflection film 3 (Si-ARC) laminated on the organic layer 4, and an ArF resist film 2 laminated on the ArF resist film 2.

FIG. 2B is a diagram illustrating an example etching result. A left side portion of FIG. 2B illustrates an example etching result of the silicon antireflection film 3, where the etching process is performed by using plasma generated from mixture of carbon tetrafluoride ($CF_4$) gas and fluoroform ($CHF_3$) gas. A right side portion of the FIG. 2B illustrates an example etching result of the organic layer 4 after etching the silicon antireflection film 3, where the etching process is performed by using plasma generated from mixture of nitrogen ($N_2$) gas and helium ($H_2$) gas.

In the example etching result of the silicon antireflection film 3 illustrated in the left side portion of FIG. 2B, a flow ratio of the $CHF_3$ gas with respect to the $CF_4$ gas is changed. More specifically, among an upper part, a middle part, and a lower part respectively included in the left side portion of the FIG. 2B, the flow ratio of the $CHF_3$ gas with respect to the $CF_4$ gas is set to be lowest in the upper part, while the flow ratio of the $CHF_3$ gas with respect to the $CF_4$ gas is set to be highest in the lower part. Consequently, the mask selective ratio becomes highest in the lower part, while the mask selective ratio becomes lowest in the upper part. Thus, the mask selective ratio is improved as the flow ratio of the $CHF_3$ gas with respect to the $CF_4$ gas becomes higher.

However, in this method, amount of deposits on the ArF resist film 2 differs depending on patterns of fine and coarse of the ArF resist film 2. Specifically, the amount of deposits on the ArF resist film 2 increases when the pattern is fine in comparison to a case where the pattern is coarse. Bottom CD (Btm.CD) indicates a length (width) between patterns (bumps) at a bottom of etched object when the etching process on a certain film is completed. A difference of CD Bias (hereinafter, may be referred to as "CD BiasΔ") is calculated by subtracting a difference (2) between the bottom CDs of fine pattern in the etching result and in the initial state from a difference (1) between the bottom CDs of coarse pattern in the etching result and in the initial state. The etched shape of the object film becomes vertical and occurrence of loading in the etching process is suppressed as the CD BiasΔ becomes close to "0".

As illustrated in FIG. 2B, the CD BiasΔ becomes greater as the flow ratio of the $CHF_3$ gas with respect to the $CF_4$ gas increases, which degrades the etched shape of the object film since the verticality of the shape cannot be assured.

The etching result of the silicon antireflection film 3 influences the etching process of the organic layer 4 disposed under the silicon antireflection film 3. That is, as illustrated in the right side portion of FIG. 2B, the verticality of the etched shape of the organic layer 4 cannot be assured as the CD BiasΔ in the etching process of the silicon antireflection film 3 becomes greater. That is, the verticality of the etched shape is most degraded in the lower part of the right side portion of FIG. 2B. That is, the mask selective ratio can be improved as the flow ratio of the $CHF_3$ gas with respect to the $CF_4$ gas becomes higher while the etched shape of the object film is unlikely to be vertical.

Therefore, in the following, etching methods of a first embodiment and a second embodiment of the present disclosure will be described, where the mask selective ratio and the verticality of the etched shape can be compatible in the first embodiment and the second embodiment. The etching process is performed on the silicon antireflection film 3 by using the ArF resist film 2 as the mask.

First Embodiment

Figure 3:
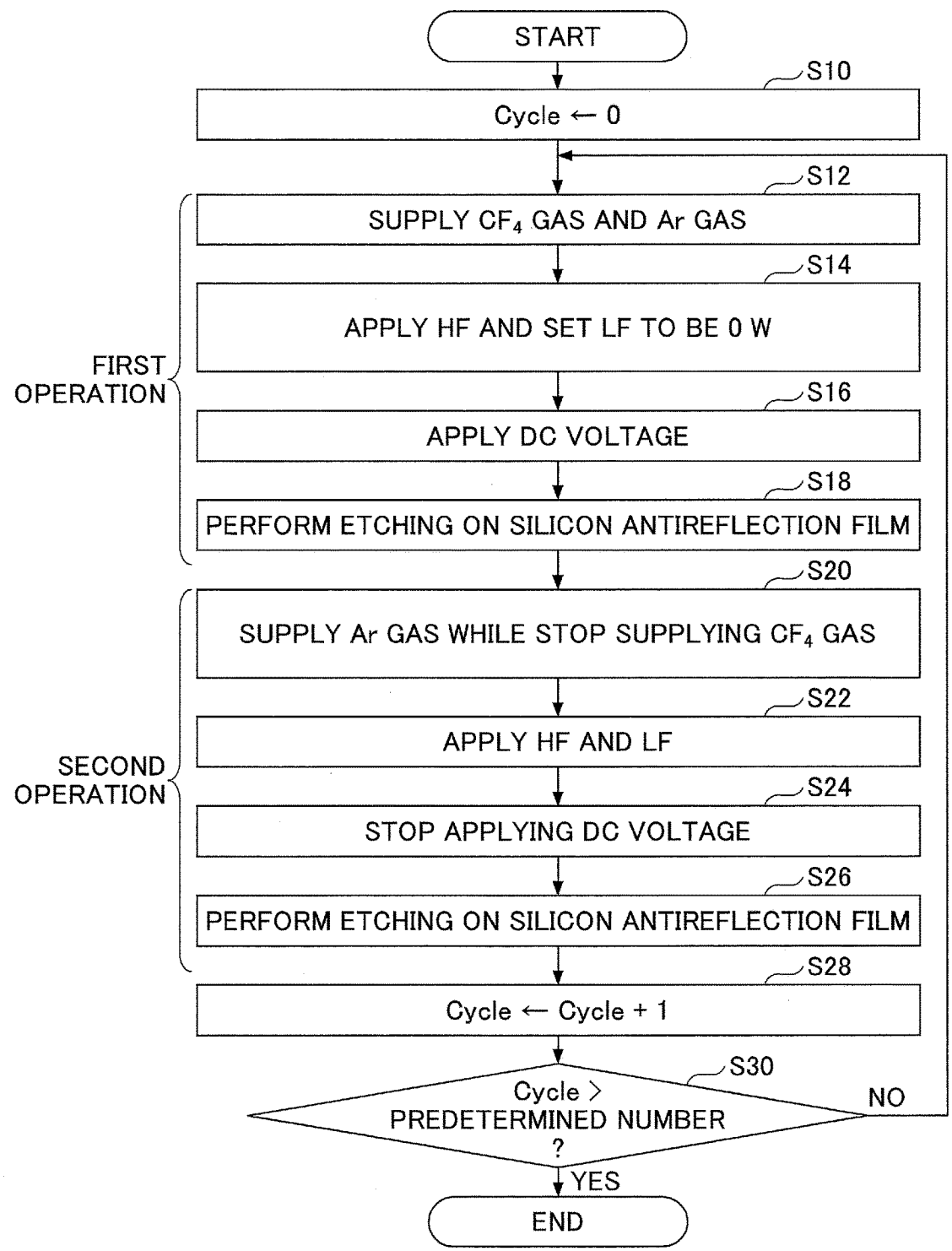
FIG. 3 is a flowchart illustrating an example etching process of a first embodiment.

For example, the etching method of the first embodiment may be performed on the wafer W mounted on the mounting table 20 in the processing chamber 10 of the plasma processing apparatus 1 illustrated in FIG. 1. An example, etching method of the first embodiment will be described with reference to FIG. 3. FIG. 3 is a flowchart illustrating an example etching process of the first embodiment.

In the etching process of the first embodiment, a first operation including steps S12-S18 illustrated in FIG. 3 and a second operation including steps S20-S26 are repeatedly performed a predetermined times, thereby performing a cycle etching. For example, a number of the cycle may be 24.

Upon the cycle etching illustrated in FIG. 3 being started, the control unit 100 initializes a cycle number "Cycle" by substituting "0" (step S10). The control unit 100 supplies a mixture of the $CF_4$ gas and Ar gas into the processing chamber 10 (step S12). However, the gases supplied in the first operation are not limited to the $CF_4$ gas and Ar gas, and may be a processing gas including fluorocarbon gas. Also, the Ar gas may not be included in the gases supplied in the first operation.

The control unit 100 applies the first high frequency power HF (high frequency power for generating plasma) at the first frequency output from the first high frequency power supply 32 (step S14). Also, the control unit 100 sets an output value of the second high frequency power LF (high frequency power for generating bias voltage) at the second frequency output from the second high frequency power supply 34 to be 0W (step S14). The control unit 100 applies a DC voltage output from the variable DC power supply 70 (step S16). Under an etching condition illustrated as steps S12-S16, the silicon antireflection film 3 is etched by using the ArF resist film 2 as the mask (step S18).

Figure 4:
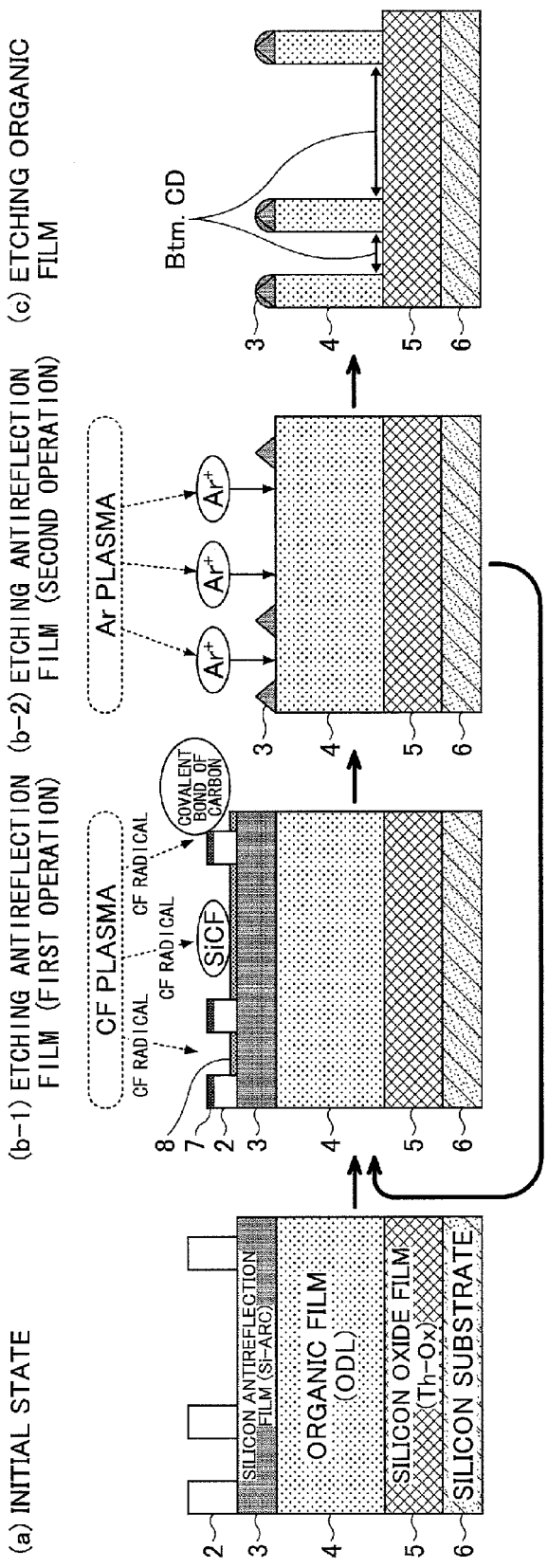
FIG. 4 is a diagram illustrating an etching process of the first embodiment.

(b-1) of FIG. 4 illustrates a state of the film on which the first operation is performed. Also, an example structure of the laminated films on the wafer W before the first operation ((b-1) of FIG. 4) is illustrated in (a) of FIG. 4. The structure of the laminated films includes the ArF resist film 2, the silicon antireflection film 3, the organic layer 4, a silicon oxide film 5, and a silicon substrate 6. The ArF resist film 2 is an example resist film. The silicon antireflection film 3 is an example antireflection film including silicon. The organic layer 4 is an example object film of the etching.

In the first operation, the processing gas including the $CF_4$ gas is supplied in the first operation, where the output value of the second high frequency power LF is set to be 0 W. Thus, positive drawing of ions in the plasma to the wafer W does not occur. Hence, mainly, CF radical included in the plasma generated in the first operation is supplied onto the ArF resist film 2 and the silicon antireflection film 3 through the openings of the pattern of the ArF resist film 2, and deposited on surfaces of respective films. Upon the CF radical being deposited on the ArF resist film 2, a protection film 7 is formed on the surface of the ArF resist film 2 through covalent bond of the carbon (C). On the other hand, Si is reacted with the CF radical to form SiCF on the surface of the silicon antireflection film 3 exposed according to the pattern of the ArF resist film 2. When the surface of the silicon antireflection film 3 is reformed into the SiCF, the silicon antireflection film 3 becomes brittle to be easily etched.

As described above, the first operation is performed. Although the output value of the second high frequency power LF at the second frequency is set to be "0" in step S14, the output value may be a value close to "0". Also, the DC voltage from the variable DC power supply 70 may not be applied in step S16.

Referring back to FIG. 3, the second operation (steps S20-S26) is performed on the films, on which the first operation has been performed. Specifically, the control unit 100 continues to supply the Ar gas while stops supplying the $CF_4$ gas (step S20). Then, the control unit 100 continues to apply the first high frequency power HF while applies the second high frequency power LF (step S22). The control unit 100 stops applying the DC voltage (step S24). The silicon antireflection film 3 is further etched under etching condition illustrated as steps S20-S26, where the ArF resist film 2 is used as the mask (step S26).

(b-2) of FIG. 4 illustrates a state of the film after the second operation. In the second operation, the $CF_4$ gas supply is stopped while only Ar gas is supplied. Also, the second high frequency power LF is applied as well as the first high frequency power HF. Thus, physical etching is fostered since mainly Ar ion in the plasma is drawn to the wafer W in the second operations, in contrast to the first operation in which chemical etching is fostered due to the CF radical. In addition, in the first operation, the surface of the silicon antireflection film 3 is reformed into the SiCF, and the silicon antireflection film 3 becomes brittle. Thus, the etching is further fostered due to implant of the Ar ion in the second operation, thereby achieving the vertical etching shape of the silicon antireflection film 3.

Also, in the first operation, the protection film 7 is formed on the ArF resist film 2 through covalent bond of the carbon. Therefore, the ArF resist film 2 is protected against the implant of the Ar ion in the second operation by the protection film 7. Hence, the mask selective ratio of the silicon antireflection film 3 with respect to the ArF resist film 2 can be improved.

Refereeing back to FIG. 3, the control unit 100 increments the number of cycle "Cycle" by "1" (steps S28), and determines whether the value of "Cycle" exceeds a predetermined number (step S30). For example, in a case where the predetermined number is 24, the control unit 100 determines "No" in step S30 because the current value of "Cycle" is 1. Then, the process is returned to step S12, and the etching process of the first operation and the second operation of the second cycle is performed. After repeating the performance of the first operation and the second operation the predetermined times, the control unit 100 terminates the process. Additionally, as illustrated in (c) of FIG. 4, the $N_2$ gas and the $H_2$ gas are supplied into the processing chamber 10 after the process is terminated, and the organic layer 4 under the silicon antireflection film 3 is etched.

As described above, according to the etching method of the first embodiment, the mask selective ratio can be improved while the etching shape of the silicon antireflection film 3 can be vertical by repeatedly performing the first operation and the second operation. Thus, the etching shape of the organic layer 4 under the silicon antireflection film 3 can be vertical.

Further, in the present embodiment, the CF ion is drawn to the gas shower head 25 that serves as an upper electrode by applying the DC voltage from the variable DC power supply 70 in the first operation. Consequently, the silicon included in the gas shower head 25 is sputtered to be mixed into the protection film 7 formed on the ArF resist film 2. Thus, plasma resistance of the ArF resist film 2 can be improved by the protection film 7, and the mask selective ratio and the verticality of the etching shape are expected to be more improved. Additionally, an example etching result of the first embodiment is illustrated in FIG. 5. A left side portion of FIG. 5 illustrates an etching result of comparative example, while the right side portion of FIG. 5 illustrates an example etching result of the first embodiment. Etching conditions of the first embodiment and the comparative example are described below.

<Etching Condition of First Embodiment>

Cycle etching (number of cycle 24) In the first operation: HF, 100 W; LF, 0 W; DC voltage, applied; and Gas, $CF_4$ and Ar. In the second operation: HF, 100 W; LF, 30 W; DC voltage, not applied; and Gas, Ar.

<Etching Condition of Comparative Example>

Non-cycle etching HF, 400 W; LF, 100 W; DC voltage, not applied; and Gas, $CF_4$. In FIG. 5, etching result is illustrated in a case where a pattern of the ArF resist film 2 is a line-and-space (fine pattern 1:1 and coarse pattern 1:5). The etching result when the silicon antireflection film 3 is etched is illustrated in upper part of FIG. 5, while the etching result when the organic layer 4 is etched is illustrated in lower part of FIG. 5.

First, the etching result when the silicon antireflection film 3 is etched is examined. According to the etching result illustrated in upper part of FIG. 5, residual film amount of the ArF resist film 2 of the first embodiment (right side portion) is greater than that of the comparative example (left side portion) by three to four times both in the fine pattern and the coarse pattern. That is, according to the etching method of the first embodiment, the mask selective ratio is improved.

Next, the etching result when the organic layer 4 is etched is examined. According to the etching result illustrated in the lower part of FIG. 5, the CD BiasiΔ of the first embodiment (right side portion) is closer to "0" in comparison to the comparative example, which causes the verticality of the etching shape to be improved.

As described above, it is proved that the mask selective ratio can be improved while the etching shape of the object film can be vertical when the first operation and the second operation under above described conditions are cyclically performed in the etching method of the first embodiment.

Second Embodiment

In the following, an etching method of the second embodiment will be described. For example, similarly to the first embodiment, the etching method of the second embodiment may be performed on the wafer W mounted on the mounting table 20 in the processing chamber 10 of the plasma processing apparatus 1 illustrated in FIG. 1.

Figure 6:
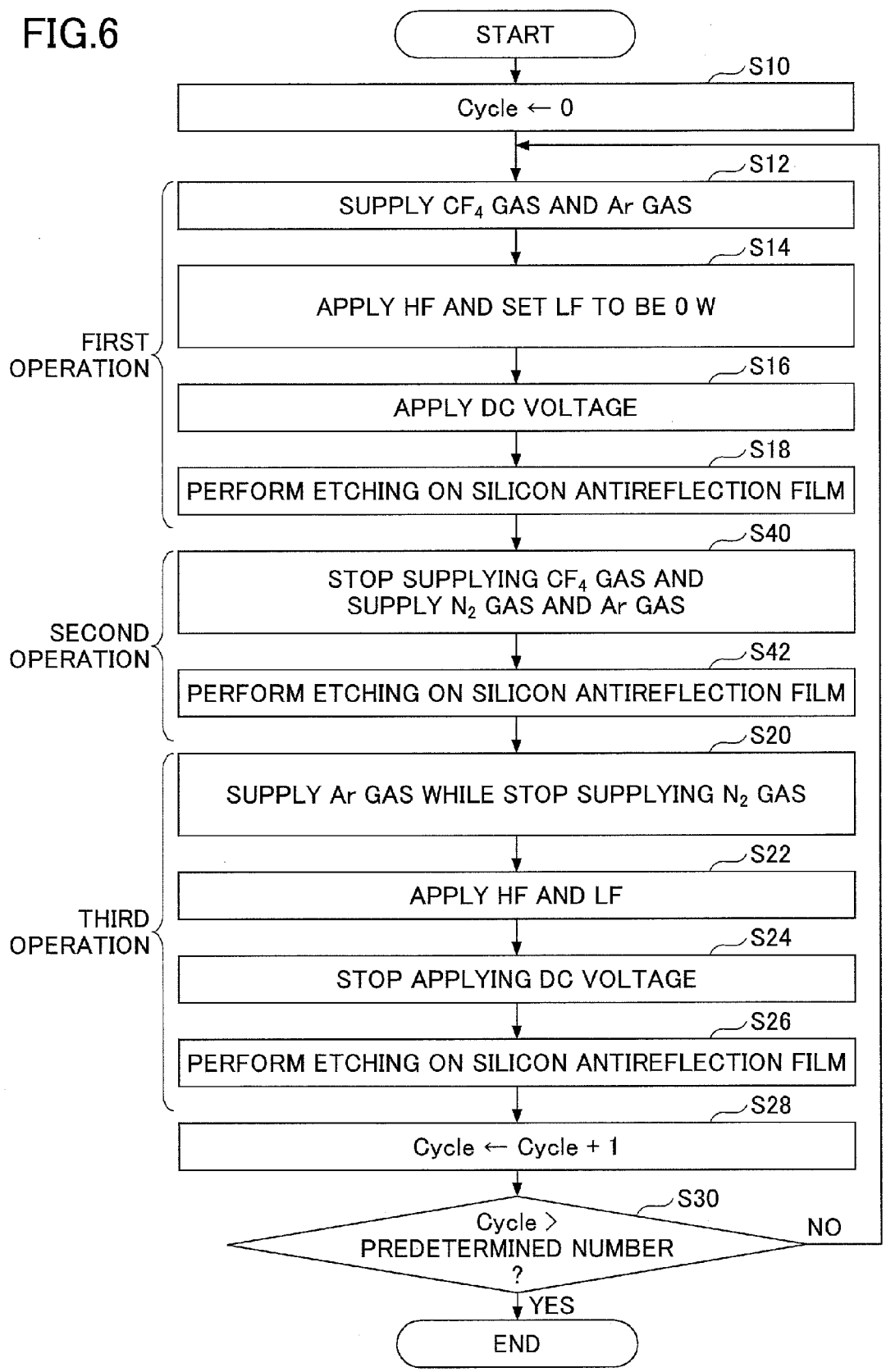
FIG. 6 is a flowchart illustrating an example etching process of a second embodiment.

An example etching method of the second embodiment will be described with reference to FIG. 6. FIG. 6 is a flowchart illustrating an example etching process of the second embodiment. Steps S12-S18 in the first operation of etching method of the second embodiment are performed similarly to steps S12-S18 in the first operation of etching method of the first embodiment (FIG. 3). Therefore, descriptions thereof are omitted. Also, steps S20-S26 in a third operation of the second embodiment are performed similarly to steps S20-S26 in the second operation of the first embodiment. Therefore, descriptions thereof are omitted. Also, processes degrading the cycle number performed in steps S10, S28, and S30 are also performed similarly to the first embodiment. The etching method of the present embodiment is the cycle etching in which a plurality of operations are repeatedly performed.

The etching process of the second embodiment is different from the etching process of the first embodiment in that a second operation is provided between the first operation and the third operation in the etching process of the second embodiment. In the second operation, the control unit 100 stops supplying the $CF_4$ gas, and supplies nitrogen ($N_2$) gas and Ar gas (step S40). The silicon antireflection film 3 is etched under the condition described above (step S42). Thus, the mask selective ratio can be improved and the etching shape of the object film can be vertical by performing a treatment operation of the surface of the ArF resist film 2 with nitrogen (N) (mainly with $N_2$ radical in plasma).

Figure 7:
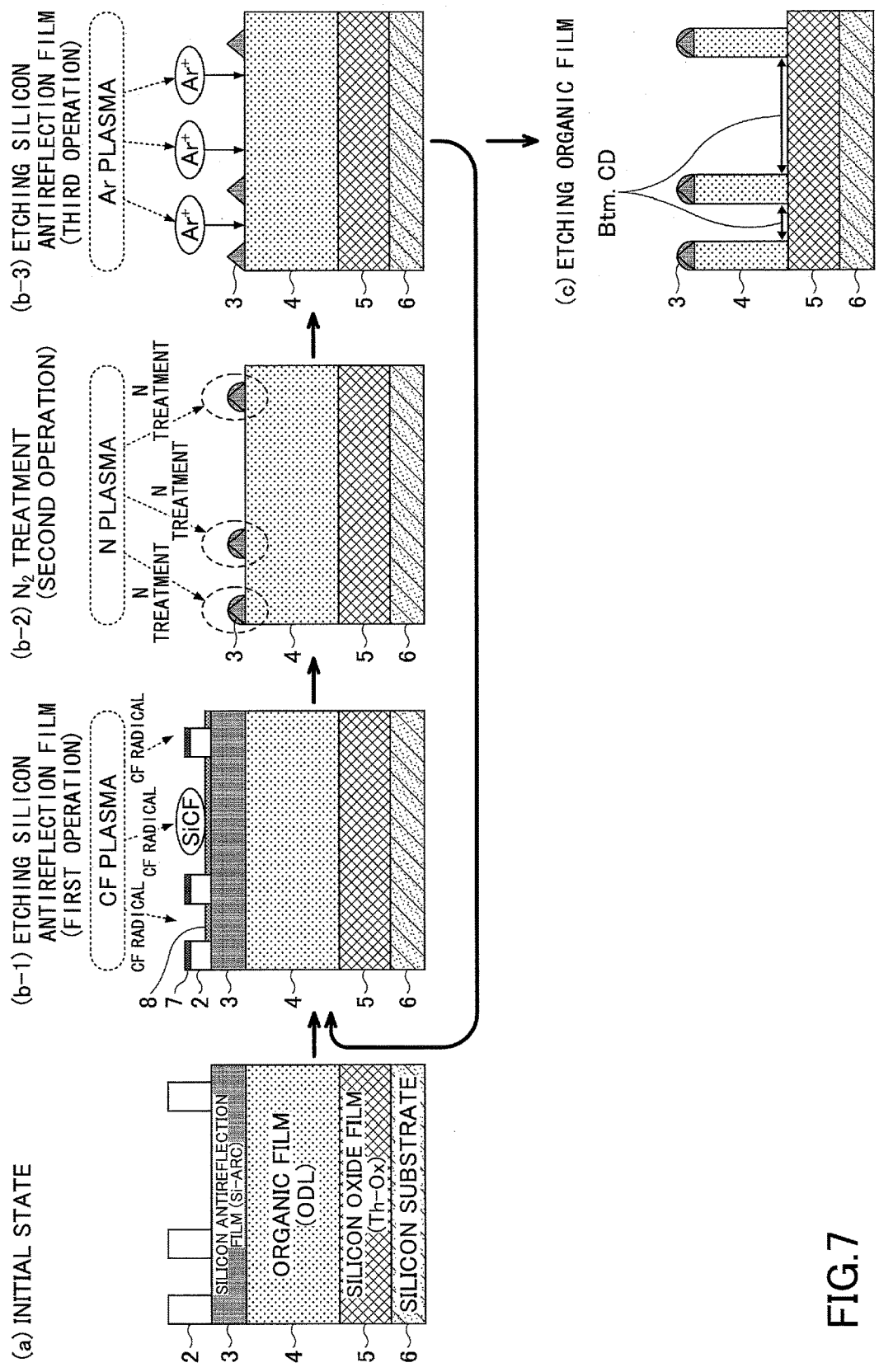
FIG. 7 is a diagram illustrating an etching process of the second embodiment.

For example, as illustrated in FIG. 7, in the second embodiment, (b-1: first operation) of FIG. 7 and (b-3: third operation) of FIG. 7 are respectively correspond to (b-1) of FIG. 5 and (b-2) of FIG. 5, which are referred in the descriptions of the first embodiment.

Further, in the etching method of the second embodiment, the second operation illustrated by (b-2) of FIG. 7 is performed between (b-1: first operation) of FIG. 7 and (b-3: third operation) of FIG. 7. In the second operation, a treatment operation of the surface of the ArF resist film 2 mainly with the $N_2$ radical in the plasma is performed. Thus, in the third operation ((b-3) of FIG. 7), etching of the ArF resist film 2 can be suppressed when the etching is fostered by drawing Ar ion in the third operation, and thereby further improving the verticality of the etching shape and the mask selective ratio.

FIG. 8 is a diagram illustrating an example etching result of the second embodiment. A left side portion of FIG. 8 illustrates an example etching result of the first embodiment, while a right side portion of FIG. 8 illustrates an example etching result of the second embodiment. Etching conditions of the second embodiment and the first embodiment are described below.

<Etching Condition of Second Embodiment>

Cycle etching (number of cycle 24) In the first operation: HF, 100 W; LF, 0 W; DC voltage, applied; and Gas, $CF_4$ and Ar. In the second operation: HF, 100 W; LF, 0 W; DC voltage, applied; and Gas, $N_2$ and Ar. In the third operation: HF, 100 W; LF, 30 W; DC voltage, not applied; and Gas, Ar.

<Etching Condition of First Embodiment>

Cycle etching (number of cycle 24) In the first operation: HF, 100 W; LF, 0 W; DC voltage, applied; and Gas, $CF_4$ and Ar. In the second operation: HF, 100 W; LF, 30 W; DC voltage, not applied; and Gas, Ar. In FIG. 8, etching result is illustrated in a case where a pattern of the ArF resist film 2 is a line-and-space (fine pattern 1:1 and coarse pattern 1:5). The etching result when the organic layer 4 is etched is illustrated.

According to the etching result illustrated in FIG. 8, the CD BiasΔ becomes more closer to "0" to further improve the verticality of the etching shape in the etching result of the second embodiment (right side portion) in comparison to the first embodiment (left side portion).

As described above, according to the etching method of the second embodiment, the verticality of the etching shape of the object film can be further improved by inserting the second operation, in which the treatment operation with N plasma is performed, between the first operation and the second operation of the first embodiment (first operation and third operation of the second embodiment).

As described above, according to the etching methods of respective embodiments of the present disclosure, the improvement of the mask selective ratio and the verticality of the etched shape can be compatible.

In addition, according to the second embodiment, amount of the deposits of the ArF resist film 2 can be controlled to be approximate the same regardless of fine/coarse of the pattern of the ArF resist film 2 according to effect of the treatment with N plasma in the second operation. Thus, the CD BiasΔ becomes closer to "0", and the verticality of the etching shape can be improved. Consequently, the mask selective ratio and the verticality of the etching shape of the object film can be further improved.

Additionally, in the first embodiment and the second embodiment, although the $CF_4$ gas is used as an example etching gas, fluorocarbon gas may be used, where the fluorocarbon gas has similar etching characteristic with respect to an oxide film to that of the $CF_4$ gas.

Also, in the first embodiment and the second embodiment, the Ar gas is supplied as an example inactive gas. However, the inactive gas is not limited to the Ar gas, and may be helium (He) gas.

Also, in the second operation of the second embodiment, although the nitrogen ($N_2$) gas is supplied, this is not a limiting example. For example, processing gas including gas containing nitrogen may be supplied. Ammonium ($NH_3$) gas can be exemplified as the processing gas including gas containing nitrogen.

Also, the silicon antireflection film 3 is not a limiting example of the antireflection film including silicon. Another antireflection film including silicon may be used.

Also, the ArF resist film 2 is not a limiting example of the resist film. An EUV resist film may be used.

Herein above, although the etching method has been described with respect to a above described embodiment for a complete and clear disclosure, the etching method is not to be thus limited but is to be construed as embodying all modifications and alternative constructions within a range of the present invention. Also, the above described embodiments and a modification or alternative construction may be combined without including inconsistency.

For example, the etching method of the present disclosure may be applied not only to the Capacitively Coupled Plasma (CCP) processing apparatus as illustrated in FIG. 1, but also to other plasma processing apparatuses. An Inductively Coupled Plasma (ICP) processing apparatus, a plasma processing apparatus using a radial line slot antenna, a Helicon Wave Plasma (HWP) processing apparatus, and an Electron Cyclotron Resonance Plasma (ECR) processing apparatus may be included in the other plasma processing apparatuses.

In the embodiments described above, although the etching process is performed on a semiconductor wafer W, the etching process may be performed on various types of substrates used for a LCD (Liquid Crystal Display) and a FPD (Flat Panel Display), a photomask, a CD substrate, a printed substrate, and the like.

What is claimed is:

1. An etching method for etching an antireflection film including silicon according to a pattern of a resist film by using plasma processing with respect to a processing object,
    the processing object including an etching object film, the antireflection film including silicon laminated on the etching object film, and the resist film laminated on the antireflection film including silicon, the method comprising:
    first generating plasma of a processing gas containing a fluorocarbon gas in a processing chamber, the processing object being disposed in the processing chamber, said first generating plasma being performed while applying a plasma generating power and applying a radio frequency power for generating a bias voltage at 30 W or lower;

stopping supply of the processing gas containing the fluorocarbon gas in a processing chamber, and second generating plasma of a processing gas containing noble gas in the processing chamber without supplying the processing gas, the processing object being disposed in the processing chamber;

wherein a set of the first generating and the second generating are repeatedly performed, and wherein the second generating is performed after the fluorocarbon gas is stopped after the first generating, and wherein only the noble gas is supplied during the second generating.

2. The etching method according to claim 1, wherein the first generating is performed without applying the radio frequency power for generating a bias voltage.

3. The etching method according to claim 2, wherein the first generating and the second generating are performed with applying a DC voltage.

4. The etching method according to claim 3, wherein the processing gas containing a gas containing nitrogen includes at least any one of a $N_2$ gas and a $NH_3$ gas.

5. The etching method according to claim 1, wherein a DC voltage starts to be applied at the first generating.

6. The etching method according to claim 5, wherein the DC voltage is stopped during the second generating is being performed while applying both the supplying the plasma generating power and the radio frequency power for generating the bias voltage.

7. The etching method according to claim 1, wherein the resist film is any one of an EUV resist film and an ARF resist film.

8. The etching method according to claim 1, wherein the processing gas containing the noble gas includes at least any one of an He gas and an Ar gas.

9. The etching method according to claim 1, wherein the processing gas containing a fluorocarbon gas includes a $CF_4$ gas.

10. The etching method according to claim 1, wherein the first and second generating are performed without supplying a polymer gas to deposit a polymer layer.

11. The etching method according to claim 1, wherein the second generating is performed while applying both the supplying the plasma generating power and the radio frequency power for generating the bias voltage.

12. An etching method for etching an antireflection film including silicon according to a pattern of a resist film by using plasma processing with respect to an processing object, the processing object including an etching object film, the antireflection film including silicon laminated on the etching object film, and the resist film laminated on the antireflection film including silicon, the method comprising:

first generating plasma of a processing gas containing a fluorocarbon gas in a processing chamber, the processing object being disposed in the processing chamber, said first generating plasma being performed while applying a plasma generating power and applying a radio frequency power for generating a bias voltage at 30 W or lower;

stopping supply of the processing gas containing the fluorocarbon gas in a processing chamber, second generating plasma of a processing gas containing a gas containing nitrogen in a processing chamber without supplying the processing gas, the processing object being disposed in the processing chamber; and third generating plasma of a processing gas containing noble gas in the processing chamber without supplying the processing gas, the processing object being disposed in the processing chamber, wherein a set of the first generating, the second generating, and the third generating are repeatedly performed, and wherein the third generating is performed after the fluorocarbon gas is stopped after the first generating, and wherein only the noble gas is supplied during the third generating.

13. The etching method according to claim 12, wherein a DC voltage starts to be applied at the first generating.

14. The etching method according to claim 13, wherein the DC voltage is stopped during the third generating is being performed while applying both the supplying the plasma generating power and the radio frequency power for generating the bias voltage.

15. The etching method according to claim 12, wherein the first generating and the second generating are performed without applying a radio frequency power for generating a bias voltage.

16. The etching method according to claim 12, wherein the first generating and the second generating are performed with applying a DC voltage.

17. The etching method according to claim 16, wherein the resist film is any one of an EUV resist film and an ARF resist film.

18. The etching method according to claim 12, wherein the processing gas containing the noble gas includes at least any one of an He gas and an Ar gas.

19. The etching method according to claim 12, wherein the processing gas containing a fluorocarbon gas includes a $CF_4$ gas.

20. The etching method according to claim 12, wherein the processing gas containing a gas containing nitrogen includes at least any one of a $N_2$ gas and a $NH_3$ gas.

21. The etching method according to claim 12, wherein the third generating is performed while applying both the supplying the plasma generating power and the radio frequency power for generating the bias voltage.

* * * * *